United States Patent [19]

Tamura et al.

[11] 4,385,804

[45] May 31, 1983

[54] MIRROR USING TRANSPARENT SYNTHETIC RESIN PLATE

[75] Inventors: Takeo Tamura; Taiji Yamabe, both of Yokohama, Japan

[73] Assignee: Nissan Motor Company, Limited, Yokohoma, Japan

[21] Appl. No.: 255,343

[22] Filed: Apr. 17, 1981

[30] Foreign Application Priority Data

Apr. 23, 1980 [JP] Japan ............................ 55-52920

[51] Int. Cl.³ ............................................. G02B 5/08
[52] U.S. Cl. ...................................... 350/310; 350/281
[58] Field of Search ......... 350/288, 310, 320, 278–281

[56] References Cited

U.S. PATENT DOCUMENTS 4,193,668  3/1980  Skinner ............................ 350/281

FOREIGN PATENT DOCUMENTS 2423654  11/1975  Fed. Rep. of Germany ...... 350/281
2923954   1/1980  Fed. Rep. of Germany .
2945780   5/1980  Fed. Rep. of Germany .

Primary Examiner—F. L. Evans
Attorney, Agent, or Firm—Schwartz, Jeffery, Schwaab, Mack, Blumenthal & Koch

[57] ABSTRACT

A mirror which utilizes a transparent synthetic resin such as a polymethyl methacrylate resin in place of glass and is suitable, e.g., as an automobile inside rearview mirror. The back side of the resin plate is coated with a reflective metal film by vacuum deposition, and at least the front side of the resin plate is coated with a surface-hardening film, which is inevitably somewhat permeable to humidity. To prevent warping of the resin plate resulting from its moisture absorption and swelling only in its front region, the reflective film and a back-coat layer covering this film are both made permeable to humidity substantially equally to the surface-hardening film. Preferred material for the reflective film is a Sn—Cu—Cr ternary alloy having high reflectivity and excellent resistance to moisture.

9 Claims, 3 Drawing Figures

MIRROR USING TRANSPARENT SYNTHETIC RESIN PLATE

BACKGROUND OF THE INVENTION

This invention relates to a mirror of the class constituted fundamentally of a hard and transparent synthetic resin plate and a thin reflective film of a metal coated on one side of the resin plate. For example, a mirror according to the invention is suitable for use as a rearview mirror in automobiles or other vehicles.

At present almost every mirror is produced by coating one side of a glass plate with a thin film of aluminum, which is a material very high and almost comparable to more expensive silver in reflectivity. For practical mirrors it is necessary to cover the reflective film of aluminum with a protective back-coat layer. One of the purposes of this back-coat layer is to prevent exposure of the reflective film to humidity because aluminum in the form of thin film is easily eroded by moisture. Since glass plate is impermeable and insusceptible to humidity, it is easy to obtain a sufficiently durable mirror by ensuring the humidity resistance of the back-coat layer.

However, durability becomes a matter for serious consideration when it is intended to produce a plastic mirror by utilizing a synthetic resin that is hard, transparent and high in optical clarity as typified by polymethyl methacrylate resin in place of glass. It is not so difficult to deposit a thin film of aluminum on one side of a plate of such a resin, and an impermeable back-coat layer necessary to the aluminum film can be formed with little difficulty. The problem arises from the fact that synthetic resins useful as mirror body material are generally hydroscopic to some extent. The transparent plate of a plastic mirror gradually absorbs moisture from the atmosphere and as a consequence undergoes swelling, but because of the existence of the impermeable back-coat layer on the back side the swelling of the resin plate occurs exclusively on the front side. Therefore, gradually the resin plate warps to have an irregularly convex front surface. Of course such deformation or distortion of the mirror body means serious degradation of the quality of the mirror.

Since the resin plate of a plastic mirror is liable to suffer scratches, it becomes necessary to coat the front surface of the resin plate (optionally the other surfaces, too) with a transparent surface-hardening film by using, for example, an organosilicon polymer as the coating material. The above explained problem arisen from hygroscopicity of the resin will dissolve if this surface-hardening film can be made impermeable to humidity. Actually, however, no currently available surface-hardening coating material for synthetic resins can give a film sufficiently high in both transparency and impermeability to humidity.

Meanwhile, there is an eager demand for fully practical plastic mirrors in various fields. In automobiles industries, for example, a plastic inside rearview mirror has been considered to be advantageous in its nonbreakableness that is favorable to the safety of the driver in case of an accident and also in its light weight that contributes to the reduction of the gross weight of the car. In some cases where the mirror body has a relatively intricate shape as exemplified by a cross-sectionally wedge-like shape of a usual inside rearview mirror, even a reduction of the production cost can be expected by the employment of a synthetic resin mirror body which can be easily be shaped by a method high in productivity, such as injection molding, without the need of any machining operation. Until now, however, the demand has not yet been met mainly by reason of the above described problem.

SUMMARY OF THE INVENTION

It is an object of the present invention to provide a mirror which utilizes a transparent synthetic resin as the material of the mirror body but, nevertheless, does not undergo perceptible distortion or warping by the influence of humidity.

A mirror according to the invention comprises a transparent plate of a synthetic resin, a surface-hardening film coated at least on a front surface of the resin plate, a reflective film of a metal resistant to moisture deposited on the back side of the resin plate and a back-coat layer closely covering the outer surface of the reflective film, and the surface-hardening film, the reflective film and the back-coat layer are all made substantially equally permeable to humidity.

It is the fundamental thought of the present invention to allow the transparent resin plate of the mirror to absorb some moisture from its back side substantially at the same absorption rate as the inevitable absorption of moisture from the front side. Based on this thought, both the back-coat layer and the reflective metal film are made permeable to humidity substantially equivalently to the surface-hardening film which is inevitably permeable to humidity as described hereinbefore. Since the resin plate in this mirror is allowed to absorb moisture from its both sides in a balanced manner, even when the resin plate swells to some extent as the result of moisture absorption the swelling proceeds similarly on both sides of the plate, so that the resin plate does not undergo warping or significant distortion. In the atmosphere, therefore, this mirror is practically stable and exhibits a fully satisfactory durability.

A mirror according to the invention utilizes a metal superior in moisture resistance to aluminum as the material of the reflective film because of the humidity permeability of the back-coat layer, and the reflective film itself. Also considering the reflectivity, it is preferable to utilize a ternary alloy composed of 100 parts of tin, 15 to 150 parts of copper and 5 to 50 parts of chromium, by weight. An adequately humidity-permeable film of this alloy can be formed on the back side of the resin plate by a known vacuum deposition technique. The back side of the resin plate may be coated with the surface-hardening film in advance.

For vehicles typified by automobiles, the invention can be embodied in an inside rearview mirror which is comparable to a glass mirror in quality and appearance and advantageous in lightness of weight and undangerousness in case of an accident. Of course the applications of the invention are not limited to rearview mirrors in vehicles. For example, the invention is applicable to mirrors for bathrooms and mirrors to be set up at curves in roads, too.

DESCRIPTION OF THE PREFERRED EMBODIMENTS

Figure 1:
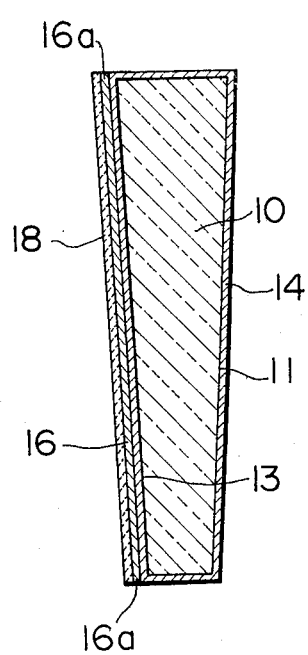
FIG. 1 is a cross-sectional view of a vehicle inside rearview mirror as an embodiment of the present invention.

FIG. 1 shows an example of a mirror according to the invention designed as an inside rearview mirror for vehicles such as automobiles. Indicated at 10 is a transparent mirror body which is made of a synthetic resin high in optical clarity as typified by polymethyl methacrylate resin. When viewed from a front surface 11, the mirror body 10 has a laterally elongate rectangular shape. The front surface 11 and the opposite surface 13 are not parallel to each other because this mirror body 10 is so shaped as to be wedge-like in cross section with the object of avoiding glaringness of the mirror during night running of the vehicle. This organic glass mirror body 10 can readily be shaped by an injection molding process.

To afford the mirror body 10 with sufficient scratch-resistivity, the front and back surfaces 11, 13 and the edge faces of the mirror body 10 are coated with a thin and transparent surface-hardening film 14 the material of which is an organosilicon polymer, for example, prepared from triethoxymethyl silane $CH_3Si(OC_2H_5)_3$. As described hereinbefore, it is inevitable that this film 14 is somewhat permeable to humidity. In the case of a surface-hardening film (14) of the aforementioned organosilicon polymer coated on a polymethyl methacrylate resin plate to have a thickness of 5–10 microns, the rate of moisture absorption in the resin plate through the surface-hardening film is about 3 $g/m^2$.24 hr when tested in an atmosphere maintained at 50° C. and 98% RH.

To provide a mirror surface, the back surface 13 of the body 10 already coated with the surface-hardening film 14 is further coated with a thin reflective film 16 by vacuum deposition of a ternary alloy composed of 100 parts by weight of Sn, 15–150 parts by weight of Cu and 5–50 parts by weight of Cr. This ternary alloy is preferred in the present invention because of its good reflectivity and excellent resistance to erosion by the influence of moisture. This alloy is slightly inferior in reflectivity to aluminum, but this alloy within the above-mentioned composition range exhibits fully satisfactory reflectivity values of 70–75% when measured in the form of the vacuum deposited film 16.

As a mechanical protection for the thin reflective film 16, a back-coat layer 18 is formed so as to closely cover the entire area of the outer major surface of the reflective film 16. As a primary feature of the invention, this back-coat layer 18 is made microscopically porous and adequately permeable to humidity so as to become practically equivalent in humidity permeability to the surface-hardening film 14. There are various known materials and coating methods available for the humidity-permeable back-coat layer 18. For example, the back-coat layer 18 of excellent properties can be obtained by applying a resin-based paint containing a relatively large amount of a powdered inorganic filler material such as calcium carbonate, barium carbonate and/or aluminum silicate. As a particular example of this type of coating method, it is possible to form a back-coat layer 18 sufficiently high in physical strength and appropriate in humidity permeability by the application of a paint which comprises an alkyd resin as binder and a calcium carbonate powder (e.g. 1–8 microns in particle size) amounting to 45–50% by weight of the alkyd resin so as to afford a thickness of about 10 microns to the resultant back-coat layer 18. The reflective film 16, too, is required to be practically equivalent in humidity permeability to the surface-hardening film 14. The requirement can be met by forming this film 16 by a conventional vacuum deposition technique to a thickness in the range from 0.025 to 0.10 microns, and more preferably in the range from about 0.05 microns to about 0.06 microns.

From a practical viewpoint, the rearview mirror of FIG. 1 is well comparable to a conventional mirror given by a glass plate coated with an aluminum film owing to the high transparency of the polymethyl methacrylate resin body 10 and good reflectively of the Sn—Cu—Cr alloy film 16. Moreover, this rearview mirror is advantageous in its lightness in weight and toughness or unbreakableness of the resin body 10. Besides, the possibility of shaping the cross-sectionally wedge-shaped body 10 by a simple injection molding process without the need of any machining operation leads to reduction of the total cost of production compared with the production of a conventional glass mirror of the same shape.

As the most remarkable effect of the invention, the rearview mirror of FIG. 1 is quite stable and can stand long use in either dry or humid atmospheres. The reason is as follows.

Since the surface-hardening film 14 has a certain degree of permeability to humidity, moisture arrives at the front surface 11 of the mirror body 10 during use of the mirror in the atmospheric air, so that it is inevitable that the resin body 11 absorbs some moisture from its front surface 11 and tends to undergo slight swelling in a region contiguous to the front surface 11. At the same time, moisture arrives at the back surface 13 of the body 10 too because of the humidity permeability of the back-coat 18 and the reflective film 16. Accordingly the body 10 absorbs moisture also from its back surface 13 and tends to undergo slight swelling on the back side, too. Since the back-coat 18 and the reflective film 16 are made equivalent in humidity permeability to the surface-hardening film 14, the absorption of moisture in the body 10 and resultant swelling of the body 10 on the back side proceed similarly to these phenomena on the front side. For this reason, even when the mirror body 10 actually swells by absorption of considerable moisture, the swelling occurs on both the front and back sides of the body 10 in an almost completely balanced manner. Therefore, swelling of the body 10 does not result in such distortion or warping of the body 10 as actually degrades the function of the mirror.

Figure 2:
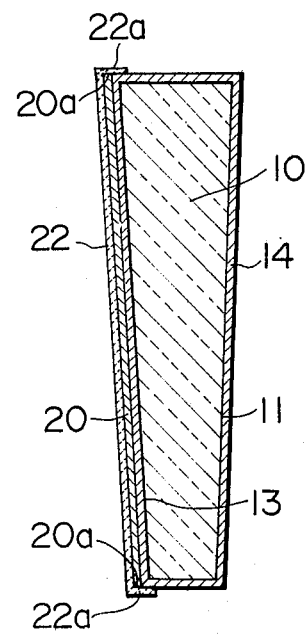
FIG. 2 is a cross-sectional view of a rearview mirror resembling to the mirror of FIG. 1 but is not in accordance with the present invention.

FIG. 2 shows a suppositional rearview mirror which is resembling to the mirror of FIG. 1 but is not in accordance with the present invention. That is, the mirror of FIG. 2 has the same polymethyl methacrylate resin body 10 coated with the transparent surface-hardening film 14 as the mirror body in FIG. 1, but a thin reflective film 20 coated on the back side of this body 10 is an aluminum film as is usual in glass plate mirrors. A back-coat layer 22 closely covers the outer surface of the aluminum reflective film 20. Since aluminum in the form of a thin film such as a film formed by a vapor deposition technique is easily eroded by moisture, the back-coat layer 22 in FIG. 2 is required to be practically impermeable to humidity, and it becomes necessary to extend the back-coat layer 22 to marginal regions of the edge faces of the resin body 10, as indicated at 22a in FIG. 2, so as to completely cover the edge faces 20a of the reflective film 20.

The mirror of FIG. 2 is somewhat better in reflectivity than the mirror of FIG. 1 owing to the use of aluminum as the material of the reflective film 20, but this mirror is impracticable because of a strong tendency of the resin body 10 to warping by the influence of humidity. Since the back-coat 22 does not allow moisture to arrive at the back surface 13 of the body 10, swelling of the body 10 resulting from absorption of moisture occurs only on the front side. As a consequence the body 10 warps in such a way that the front surface 11 becomes a convex surface.

Referring again to FIG. 1, it is an additional merit of a mirror according to the invention that there is no need of extending the humidity-permeable back-coat layer 18 so as to cover the edge faces 16a of the reflective film 16 and, therefore, the back-coat 18 can be formed with high productivity.

An experiment was carried out to examine the moisture resistance of the ternary alloy reflective film 16 according to the invention in comparison with films of several different kinds of metals.

Each reflective film subjected to this test was formed on a major surface of a polymethyl metahcrylate resin plate (5 cm × 10 cm in width and 3 mm in thickness) by vacuum deposition to a thickness of 0.05-0.06 microns. No back-coat was formed on the reflective film. The tested materials of the reflective film were as follows.

Sample A: Sn—Cu—Cr alloy composed of 100 parts of Sn, 70 parts of Cu and 20 parts of Cr (by weight). Reflectively of the film was about 70%.

Sample B: Sn—Cu binary alloy. Reflectivity was about 70%.

Sample C: Sn alone. Reflectivity was about 70%.

Sample D: Cu alone. Reflectivity was about 50%.

Sample E: Al alone. Reflectively was about 80%.

Figure 3:
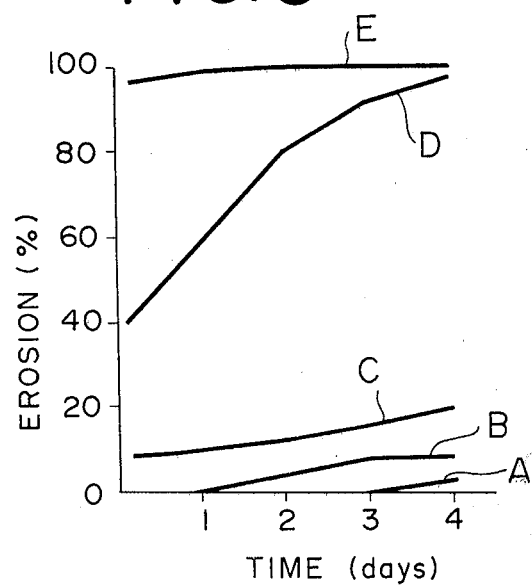
FIG. 3 is a graph showing the result of a humidity endurance test carried out on a reflective metal film according to the invention and several films not in accordance with the invention.

These samples were kept in a chamber maintained at a constant temperature of 50° C. and a constant relative humidity of 98% for a period of four days and subjected to visual observation at regular intervals to examine the extent of erosion of the reflective films. FIG. 3 shows the results of this experiment, wherein the erosion refers to the percentage of significantly damaged or disappeared area of each reflective film to the initial surface area (50 cm$^2$) of the film. The curves A-E in FIG. 3 represents the above listed samples A-E, respectively.

As can be seen, the aluminum film of Sample E was eroded very rapidly and significantly. The erosion reached about 96% during initial three hours of the test and became practically 100% within 24 hours. Although aluminum is superior in reflectivity, this test verifies the impossibility of using aluminum as the material of the reflective film 16 in the mirror according to the invention and the necessity of the provision of an impermeable back-coat in any mirror having a reflective film of aluminum.

In contrast, the erosion of the reflective film of Sample A (according to the invention) was only about 2.5% even when examined after the lapse of four days from the start of the test. This sample was satisfactory also in the reflectivity value (70%). Similarly good results were obtained also when the amounts of copper and chromium in the ternary alloy were varied within the ranges of 15-150 parts and 5-50 parts by weight, respectively, per 100 parts by weight of tin. For example, the moisture resistance of the vacuum deposited film was nearly as represented by the curve A in FIG. 3 and the reflectivity was 70-75% when the alloy was composed of 100 parts of Sn, 40 parts of Cu and 5 parts of Cr, and also when composed of 100 parts of Sn, 15 parts of Cu and 10 parts of Cr.

Sample B was prepared so as to realize the same level of reflectivity (70%) by using a Sn—Cu binary alloy, but the film of this alloy was eroded at a higher rate than the ternary alloy film of Sample A. The pure tin film of Sample C, too, exhibited the same level of reflectivity (70%), but this film was eroded more rapidly and significantly than the film of Sample B. Judging from the results of this test, the reflective films of Samples B and C are not suitable to practical mirrors. The pure copper film of Sample D was inferior in reflectivity (50%) and very poor in the resistance to moisture.

What is claimed is:

1. A mirror comprising:
   a transparent plate of a synthetic resin;
   a surface-hardening film coated at least on a front surface of the resin plate;
   a reflective film of a metal resistant to moisture deposited on the back side of the resin plate; and
   a back-coat layer closely covering the outer surface of the reflective film,
   the surface-hardening film, the reflective film and the back-coat layer being all substantially equally permeable to humidity.

2. A mirror according to claim 1, wherein said metal is a ternary alloy composed of 100 parts of Sn, 15 to 150 parts of Cu and 5 to 50 parts of Cr, by weight.

3. A mirror according to claim 2, wherein said reflective film is formed by vacuum deposition of said ternary alloy and has a thickness in the range from 0.025 to 0.10 microns.

4. A mirror according to claim 3, wherein said thickness is in the range from about 0.05 microns to about 0.06 microns.

5. A mirror according to claim 1, wherein said synthetic resin is a polymethyl methacrylate resin.

6. A mirror according to claim 1, wherein said surface-hardening film is formed essentially of an organosilicon polymer.

7. A mirror according to claim 1, wherein the entire surfaces of the resin plate are coated with said surface-hardening film.

8. A mirror according to claim 1, wherein said back-coat layer is a resin layer containing dispersed therein an inorganic filler material in powder form.

9. A mirror according to claim 1, wherein the front and back surfaces of the resin plate are both flat surfaces but are unparallel to each other.

* * * * *

UNITED STATES PATENT AND TRADEMARK OFFICE
CERTIFICATE OF CORRECTION

PATENT NO. : 4,385,804
DATED : May 31, 1983
INVENTOR(S) : Takeo TAMURA and Taiji YAMABE It is certified that error appears in the above—identified patent and that said Letters Patent is hereby corrected as shown below:

On the Title page, Assignee should read:

-- NISSAN MOTOR COMPANY, LIMITED,
   YOKOHAMA, JAPAN
and
   MARUI INDUSTRIAL COMPANY, LIMITED
   TOKYO, JAPAN --

Signed and Sealed this

Twelfth Day of March 1985

[SEAL]

Attest:

DONALD J. QUIGG

Attesting Officer     Acting Commissioner of Patents and Trademarks